(12) United States Patent
Byun et al.

(10) Patent No.: US 12,476,114 B2
(45) Date of Patent: Nov. 18, 2025

(54) CHEMICAL MECHANICAL POLISHING METHOD AND METHOD FOR FABRICATING SEMICONDUCTOR DEVICE USING THE SAME

(71) Applicant: Samsung Electronics Co., Ltd., Suwon-si (KR)

(72) Inventors: Yearin Byun, Suwon-si (KR); In Kwon Kim, Suwon-si (KR); Sang Kyun Kim, Suwon-si (KR); Hyo San Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 228 days.

(21) Appl. No.: 18/190,300

(22) Filed: Mar. 27, 2023

(65) Prior Publication Data

US 2023/0352310 A1 Nov. 2, 2023

(30) Foreign Application Priority Data

May 2, 2022 (KR) .................. 10-2022-0054139

(51) Int. Cl.
*H01L 21/31* (2006.01)
*C09G 1/02* (2006.01)
(Continued)

(52) U.S. Cl.
CPC .......... *H01L 21/31055* (2013.01); *C09G 1/02* (2013.01); *H01L 21/02052* (2013.01);
(Continued)

(58) Field of Classification Search
CPC ......... H01L 21/31055; H01L 21/02052; H01L 21/02065; H01L 21/02074; H01L 21/3212;
(Continued)

(56) References Cited

U.S. PATENT DOCUMENTS 9,120,952 B2 9/2015 Gupta et al.
10,392,531 B2 8/2019 Raman et al.
(Continued)

FOREIGN PATENT DOCUMENTS

CN 108822739 A 11/2018
JP 2007273680 A * 10/2007
(Continued)

OTHER PUBLICATIONS

Mia Kurek, Edible coatings minimize fat uptake in deep fat fried products: A review (Year: 2017).*

*Primary Examiner* — Duy Vu N Deo
(74) *Attorney, Agent, or Firm* — HARNESS, DICKEY & PIERCE, P.L.C.

(57) ABSTRACT

A chemical mechanical polishing method may include polishing a polishing object at a first temperature using a chemical mechanical polishing slurry; and removing the chemical mechanical polishing slurry on the polishing object at a second temperature different from the first temperature. The chemical mechanical polishing slurry may include abrasive particles, a thermoresponsive inhibitor, and deionized water. The thermoresponsive inhibitor may include a thermoresponsive polymer exhibiting a phase-transition between the first temperature and the second temperature. The thermoresponsive polymer may be adsorbed to the hydrophobic layer at the first temperature and desorbed from the hydrophobic layer at the second temperature.

20 Claims, 11 Drawing Sheets

(51) Int. Cl.
*H01L 21/02* (2006.01)
*H01L 21/3105* (2006.01)
*H01L 21/321* (2006.01)

(52) U.S. Cl.
CPC .. *H01L 21/02065* (2013.01); *H01L 21/02074* (2013.01); *H01L 21/3212* (2013.01)

(58) Field of Classification Search
CPC .. H01L 21/31053; H01L 21/7684; C09G 1/02
USPC .................................................. 438/690–693
See application file for complete search history.

(56) References Cited

U.S. PATENT DOCUMENTS

| | | | |
|---|---|---|---|
| 11,135,624 | B2 | 10/2021 | Jo et al. |
| 2006/0255314 | A1* | 11/2006 | Suzuki ..................... C09G 1/02 |
| | | | 438/692 |
| 2007/0175104 | A1 | 8/2007 | Nishiyama et al. |
| 2021/0017422 | A1* | 1/2021 | Iwano .................. C09K 3/1463 |
| 2021/0299814 | A1* | 9/2021 | Sakashita ............... B24B 37/015 |
| 2022/0127495 | A1* | 4/2022 | Hwang ................ C09K 3/1463 |

FOREIGN PATENT DOCUMENTS

| | | | |
|---|---|---|---|
| JP | 5007062 | B2 | 8/2012 |
| JP | 2019-104781 | A | 6/2019 |
| KR | 20100011030 | A | 2/2010 |
| KR | 102281885 | B1 | 7/2021 |

\* cited by examiner

CHEMICAL MECHANICAL POLISHING METHOD AND METHOD FOR FABRICATING SEMICONDUCTOR DEVICE USING THE SAME

CROSS-REFERENCE TO RELATED APPLICATION

This application claims priority from Korean Patent Application No. 10-2022-0054139, filed on May 2, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a chemical mechanical polishing method and/or a method for fabricating a semiconductor device using the same. More specifically, the present disclosure relates to a chemical mechanical polishing method for a polishing object including a hydrophobic layer and/or a method for fabricating a semiconductor device using the same.

2. Description of the Related Art

In a fabricating process of the semiconductor device, a chemical mechanical polishing (CMP) process is widely used as a planarization technique for removing steps between layers formed on a substrate. The chemical mechanical polishing process may effectively planarize layers formed on the substrate, by injecting a polishing slurry including abrasive particles between a substrate and a polishing pad and rubbing the substrate using the polishing pad.

SUMMARY

Inventive concepts provide a chemical mechanical polishing method that improves the quality and/or productivity of the chemical mechanical polishing process.

Inventive concepts also provide a method for fabricating a semiconductor device having improved quality and/or productivity.

However, inventive concepts are not restricted to the ones set forth herein. The above and other features will become more apparent to one of ordinary skill in the art to which the present disclosure pertains by referencing the detailed description of the presented embodiments given below.

According to an example embodiment, a chemical mechanical polishing method of a polishing object including a hydrophobic layer may include polishing the polishing object at a first temperature using a chemical mechanical polishing slurry; and removing the chemical mechanical polishing slurry on the polishing object at a second temperature, the second temperature being different from the first temperature. The chemical mechanical polishing slurry may include abrasive particles, a thermoresponsive inhibitor, and deionized water. The thermoresponsive inhibitor may include a thermoresponsive polymer exhibiting a phase-transition between the first temperature and the second temperature. The thermoresponsive polymer may be adsorbed to the hydrophobic layer at the first temperature and desorbed from the hydrophobic layer at the second temperature.

According to an example embodiment, a chemical mechanical polishing method of a polishing object including a hydrophobic layer may include polishing the polishing object using the hydrophobic layer as an etch stop layer and using a chemical mechanical polishing slurry; and removing the chemical mechanical polishing slurry on the polishing object at a second temperature. The chemical mechanical polishing slurry may include abrasive particles, a thermoresponsive inhibitor, and deionized water. The thermoresponsive inhibitor may include a thermoresponsive polymer. The thermoresponsive polymer may have a lower critical solution temperature (LCST). The polishing the polishing object may be performed at a first temperature, the first temperature being higher than the lower critical solution temperature. The second temperature may be lower than the lower critical solution temperature.

According to an example embodiment, a method for fabricating a semiconductor device may include forming a polishing object on a semiconductor substrate, the polishing object including a hydrophobic layer; polishing the polishing object at a first temperature using a chemical mechanical polishing slurry; and removing the chemical mechanical polishing slurry on the polishing object at a second temperature, the second temperature being different than the first temperature. The chemical mechanical polishing slurry may include abrasive particles, a thermoresponsive inhibitor, and deionized water. The thermoresponsive inhibitor may include a thermoresponsive polymer exhibiting a phase-transition between the first temperature and the second temperature. The thermoresponsive polymer may be adsorbed to the hydrophobic layer at the first temperature and desorbed from the hydrophobic layer at the second temperature.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

A chemical mechanical polishing method and/or a method for fabricating a semiconductor device using the same according to example embodiments will be described below referring to FIGS. 1 to 13.

Figure 1:
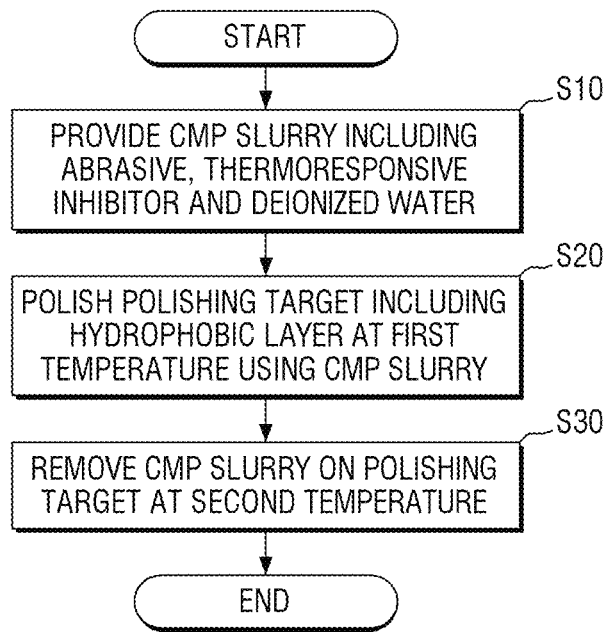
FIG. 1 is an example flow chart for explaining a chemical mechanical polishing method according to some embodiments.

FIG. 1 is an example flow chart for explaining a chemical mechanical polishing method according to some embodiments. FIGS. 2 to 6 are intermediate process diagrams for explaining a method for fabricating a semiconductor device using the chemical mechanical polishing method according to some embodiments.

Referring to FIG. 1, a chemical mechanical polishing slurry including abrasive particles, a thermoresponsive inhibitor, and a deionized water (DI water) is provided (S10).

The abrasive particles may function as abrasives. The abrasive particles may include metal oxides, metal oxides coated with organic matter or inorganic matter, or metal oxides of colloidal state. For example, the abrasive particles may include, but are not limited to, at least one of silica, alumina, ceria, titania, zirconia, magnesia, germania, mangania, and combinations thereof.

In some embodiments, the abrasive particles may include silica. When the abrasive particles include silica, efficiency of the chemical mechanical polishing process for polishing objects including hydrophobic layer may be enhanced. In some embodiments, the abrasive particles may include colloidal silica.

The shape of the abrasive particles may be various shapes, such as a spherical shape, a square shape, a needle shape, and a plate shape.

An average size of the abrasive particles (e.g., average particle size) may be from about 10 nm to about 300 nm. When the size of the abrasive particles is less than about 10 nm, a polishing rate for the polishing object may decrease. When the size of the abrasive particles exceeds about 300 nm, surface defects may occur on the polishing object, and it may be difficult to adjust the polishing selectivity.

The abrasive particles may include particles of a single size, but may include particles of sizes of two or more mixed types. For example, the size of the abrasive particles is adjusted during the fabricating process, and may the abrasive particles have a particle size distribution of a bimodal form in which two types of particles are mixed. Alternatively, the abrasive particles may have a particle size distribution in which three types of particles are mixed to exhibit three peaks. When relatively large-sized abrasive particles and relatively small-sized abrasive particles are mixed, better dispersibility may be obtained. Also, such abrasive particles may reduce scratches on the polishing object.

The contents of the abrasive particles may be about 0.1% to about 10% by weight on the basis of 100% by weight of the chemical mechanical polishing slurry composition. If the contents of the abrasive particle are less than about 0.1% by weight, the polishing rate for the polishing object may decrease. If the contents of the abrasive particles exceed about 10% by weight, surface defects may occur on the polishing object, and it may be difficult to adjust the polishing selectivity.

Thermoresponsive inhibitor may include thermoresponsive polymer. The thermoresponsive polymer is a polymer whose properties change with the external temperature and may exhibit a reversible phase-transition at a certain temperature.

In some embodiments, the thermoresponsive inhibitor may include at least one of a polyacrylamide-based polymer and an alkylcellulose-based polymer.

Examples of the polyacrylamide-based polymer include at least one of poly(N-isopropylacrylamide), poly(N,N'-diethylacrylamide), poly(2-carboxyisopropylacrylamide), poly(N-(L)-(1-hydroxymethyl) propylmethacrylamide, poly(N-acryloyl-N'-alkylpiperazine) and combinations thereof.

Examples of formulas representing groups in the polyacrylamide-based polymer are provided below:

(a) poly(N-isopropylacrylamide)

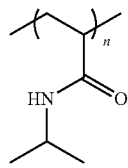

(b) poly(N,N'-diethylacrylamide)

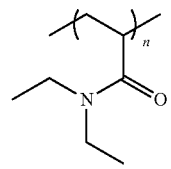

(c) poly(2-carboxyisopropylacrylamide)

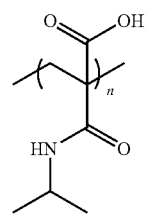

(d) poly(N-(L)-(1-hydroxymethyl) propylmethacrylamide

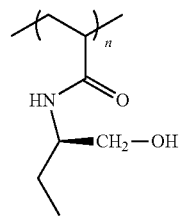

(e) poly(N-acryloyl-N'-alkylpiperazine)

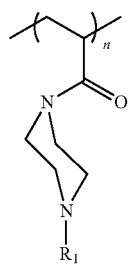

(Here, $R_1$ represents an alkyl group having 1 to 3 carbon atoms. As an example, $R_1$ may represent a methyl group, an ethyl group, or an n-propyl group.)

As an example, the alkylcellulose-based polymer may include at least one of methylcellulose, ethylcellulose, hydroxypropylcellulose, xyloglucan, and combinations thereof represented by the following compounds (f) to (i):

(f) methylcellulose

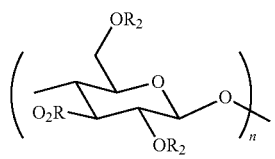

(Here, $R_2$ represents a hydrogen atom or a methyl group.)

(g) ethylcellulose

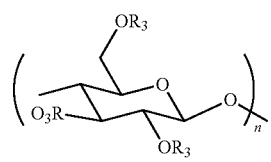

(Here, $R_3$ represents a hydrogen atom or an ethyl group.)

(h) hydroxypropylcellulose

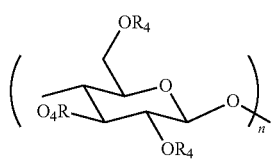

(Here, $R_4$ represents a hydrogen atom or a 2-hydroxypropyl group.)

(i) xyloglucan

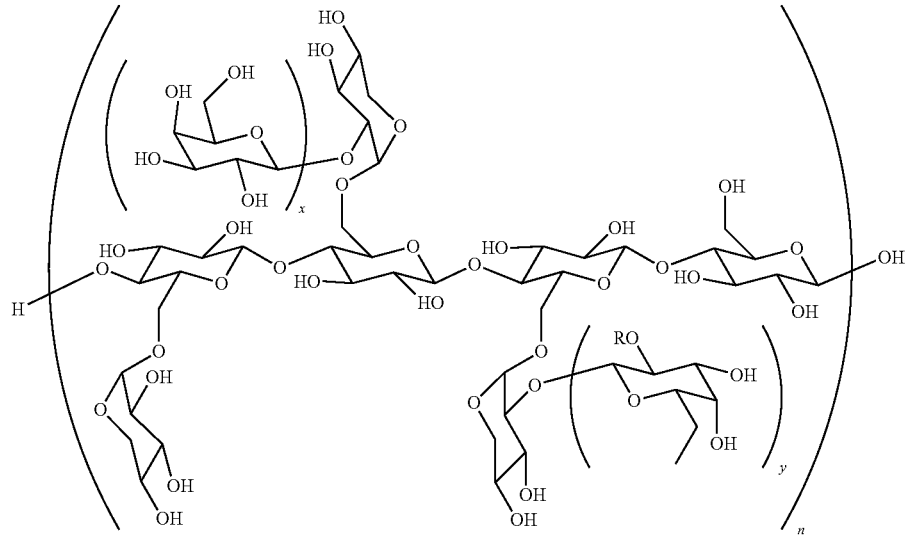

(Here, x and y each represent a natural number.)

In some embodiments, a thermoresponsive polymer may be a polymer that has a lower critical solution temperature (LCST) in aqueous solution. At temperatures lower than the lower critical solution temperature, the thermoresponsive polymer may exhibit hydrophilicity due to the predominant action of hydrophilic bonds. Conversely, at temperatures higher than the lower critical solution temperature, the thermoresponsive polymer may exhibit hydrophobicity due to the dominant action of hydrophobic bonds.

In an example, the thermoresponsive polymer may include poly(N-isopropylacrylamide). In this case, at temperatures lower than the lower critical solution temperature of poly(N-isopropylacrylamide) (e.g., about 32° C.), the polarity part of poly(N-isopropylacrylamide) may be hydrated by hydrogen bonding with water molecules. Conversely, at temperatures higher than the lower critical solution temperature of poly(N-isopropylacrylamide) (e.g., about 32° C.), isopropyl groups of poly(N-isopropylacrylamide) may be separated from the water molecules and dehydrated.

In some embodiments, the thermoresponsive polymer may have a lower critical solution temperature of about 30° C. to about 50° C. In such cases, the chemical mechanical polishing method according to some embodiments may provide an optimized polishing process.

In some embodiments, the thermoresponsive polymer may be a polymer that has an upper critical solution temperature (UPST) in aqueous solution. At temperatures higher than the upper critical solution temperature, thermoresponsive polymers may exhibit hydrophilicity. Conversely, at temperatures lower than the upper critical solution temperature, thermoresponsive polymers may exhibit hydrophobicity.

In some embodiments, the thermoresponsive polymer may have both the lower critical solution temperature (LCST) and the upper critical solution temperature (UCST). At temperatures lower than the lower critical solution temperature and higher than the upper critical solution temperature, the thermoresponsive polymer may exhibit hydrophilicity. Conversely, at temperatures higher than the lower critical solution temperature or lower than the upper critical solution temperature, the thermoresponsive polymer may exhibit hydrophobicity.

The thermoresponsive inhibitor may protect the hydrophobic layer in the polishing process to limit the polishing rate for the hydrophobic layer. For example, at a temperature at which the thermoresponsive polymer exhibits hydrophobicity (e.g., the temperature higher than the lower critical solution temperature (LCST) and/or the temperature lower than the upper critical solution temperature (UCST), the thermoresponsive polymer may be adsorbed to the hydrophobic layer to protect the hydrophobic layer.

The contents of the thermoresponsive inhibitor may be about 0.001% by weight to about 5% by weight on the basis of 100% by weight of the chemical mechanical polishing slurry composition. If the contents of the thermoresponsive inhibitor exceed about 5% by weight, the polishing rate may be excessively limited, and productivity may decrease. For example, the contents of the thermoresponsive inhibitor may be from about 0.001% to about 1% by weight. Alternatively, for example, the contents of the thermoresponsive inhibitor may be from about 0.001% to about 0.1% by weight.

The deionized water may function as both a solvent and a dispersion medium. For example, the deionized water may function as a solvent with regard to readily soluble substances, but may function as a dispersion medium with regard to particulates such as the abrasive particles. The deionized water may be included in the remainder of the chemical mechanical polishing slurry.

In some embodiments, the chemical mechanical polishing slurry may further include a pH adjuster.

The pH adjuster may adjust the pH of the chemical mechanical polishing slurry. The pH adjuster may include, for example, but not limited to, basic solutions such as lithium hydroxide (LiOH), sodium hydroxide (NaOH), potassium hydroxide (KOH), and cesium hydroxide (CsOH), and/or acidic solutions such as sulfuric acid ($H_2SO_4$), nitric acid ($HNO_3$), hydrochloric acid (HCl), and phosphoric acid ($H_3PO_4$).

The pH adjuster may be added in an amount necessary to adjust the pH of the chemical mechanical polishing slurry, and is not particularly limited. In some embodiments, the pH of the chemical mechanical polishing slurry may be adjusted to acidity or neutrality. For example, pH of the chemical mechanical polishing slurry may be from about 1 to about 7. When pH of the chemical mechanical polishing slurry exceeds about 7, the polishing efficiency may decrease.

In some embodiments, the chemical mechanical polishing slurry may further include a biocide.

The biocide may include, for example, but not limited to, isothiazolinone.

The contents of the biocide may be from about 1 ppm to about 20 ppm.

In some embodiments, the chemical mechanical polishing slurry may further include a catalyst.

The catalyst may accelerate the polishing rate of the polishing object. For example, the catalyst may include an iron (Fe)-containing compound. The iron-containing compound may include, for example, but not limited to, at least one of iron nitrate; iron sulfate; iron halide such as iron fluoride, iron chloride, iron bromide, iron iodide, iron perchlorate, iron perbromate, and iron periodate; organic iron compounds such as iron acetate, iron acetylacetonate, iron citrate, iron gluconate, iron malonate, iron oxalate, iron phthalate, iron succinate, and combinations thereof. In an example, the catalyst may include iron nitrate (III) ($Fe(NO_3)_3$).

The contents of catalyst may be about 0.1% by weight to about 1% by weight on the basis of 100% by weight of the chemical mechanical polishing slurry.

In some embodiments, the chemical mechanical polishing slurry may further include a chelating agent.

The chelating agents include, for example, but not limited to, at least one of ethylenediaminetetraacetic acid, iminodiacetic acid, diethylenetriaminepentaacetic acid, glycine, alanine, valine, leucine, isoleucine, serine, threonine, tyrosine, phenylalanine, tryptophane, aspartic acid, glutamic acid, glutamine, asparagine, lysine, arginine, histidine, hydroxylysine, cysteine, methionine, cystine, proline, sulfamic acid, hydroxyproline, and combinations thereof.

The contents of the chelating agent may be about 0.001 to about 5% by weight on the basis of 100% by weight of the chemical mechanical polishing slurry.

Next, referring to FIG. 1 again, a polishing object including a hydrophobic layer is polished at a first temperature, using the chemical mechanical polishing slurry (S20).

Figure 2:
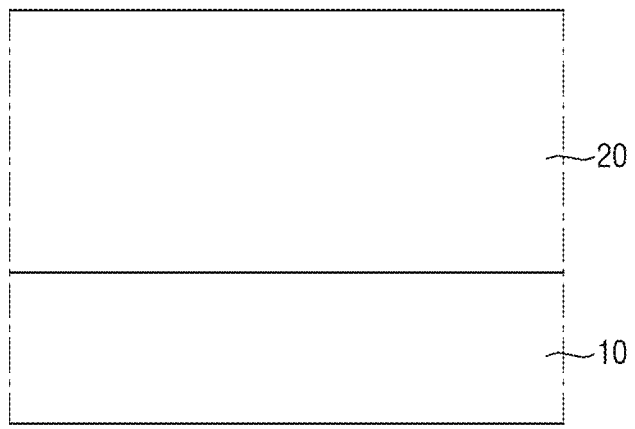
FIGS. 2 to 6 are intermediate process diagrams for explaining a method for fabricating a semiconductor device using the chemical mechanical polishing method according to some embodiments.

For example, referring to FIG. 2, a hydrophobic layer 20 may be formed on the semiconductor substrate 10.

The semiconductor substrate 10 may be, for example, bulk silicon or silicon-on-insulator (SOI). The semiconductor substrate 10 may be a silicon substrate, or may include other materials, for example, silicon germanium, indium antimonide, lead telluride, indium arsenide, indium phosphide, gallium arsenide or gallium antimonide. Alternatively, the semiconductor substrate 10 may be an epitaxial layer formed on a base substrate.

The hydrophobic layer 20 may be formed on the semiconductor substrate 10. The hydrophobic layer 20 may include a material having hydrophobicity, but not limited to, at least one of polysilicon (poly Si), SiOCH, SiOCN, SiBN, and combinations thereof.

Figure 3:
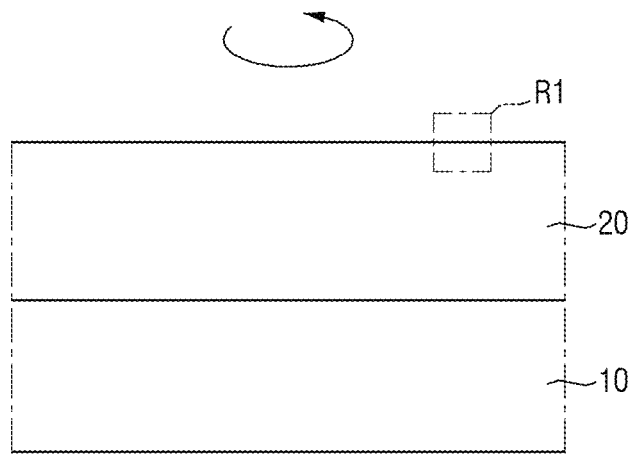
Figure 4:
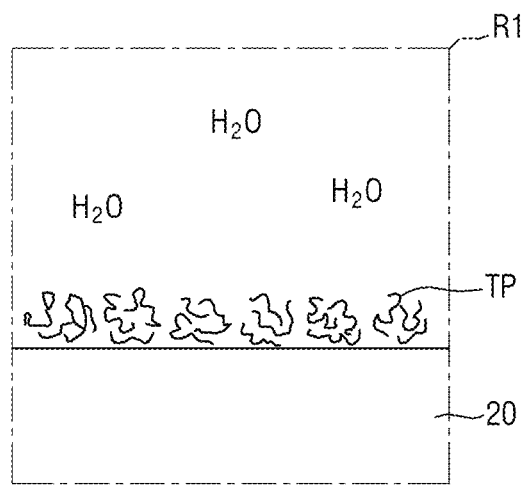

Next, referring to FIGS. 3 and 4, the hydrophobic layer 20 may be polished. For reference, FIG. 4 is a schematic enlarged view for explaining a region $R_1$ of FIG. 3.

The hydrophobic layer 20 may be a polishing object in the chemical mechanical polishing method according to some embodiments. As the hydrophobic layer 20 is polished, an upper part of the hydrophobic layer 20 may be etched and removed.

The chemical mechanical polishing slurry including abrasive particles, the thermoresponsive inhibitor and the deionized water may be used to polish the hydrophobic layer 20. In the process in which the hydrophobic layer 20 is polished, the thermoresponsive inhibitor may protect the hydrophobic layer 20 and limit the polishing rate for the hydrophobic layer 20.

Specifically, the hydrophobic layer 20 may be polished at a first temperature at which the thermoresponsive polymer TP of the thermoresponsive inhibitor exhibits hydrophobic properties. When the thermoresponsive polymer TP has a lower critical solution temperature (LCST), the first temperature may be higher than the lower critical solution temperature. Alternatively, when the thermoresponsive polymer TP has the upper critical solution temperature (UCST), the first temperature may be lower than the upper critical solution temperature.

In such a case, as shown in FIG. 4, the thermoresponsive polymer TP of the thermoresponsive inhibitor is precipitated into a globule due to the dominant action of the hydrophobic bond in the polymer, and may be separated from water molecules ($H_2O$). Such a thermoresponsive polymer TP may be adsorbed to the hydrophobic layer 20 and protect the hydrophobic layer 20, thereby improving etching selectivity, dishing and defects in the chemical mechanical polishing process for the hydrophobic layer 20.

Next, referring to FIG. 1 again, the chemical mechanical polishing slurry on the polishing target (e.g., hydrophobic layer 20) is removed at a second temperature different from the first temperature (S30).

Figure 5:
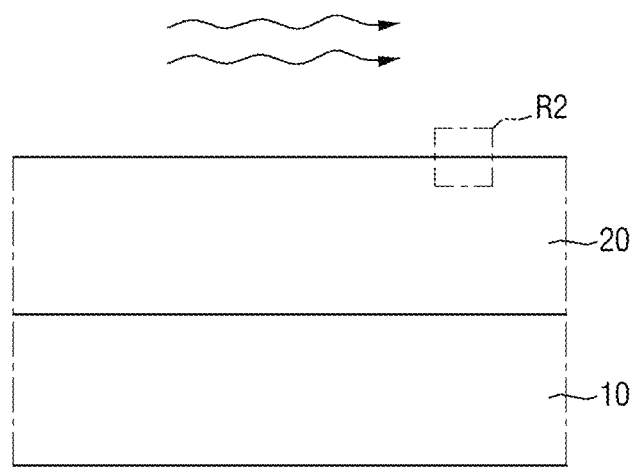
Figure 6:
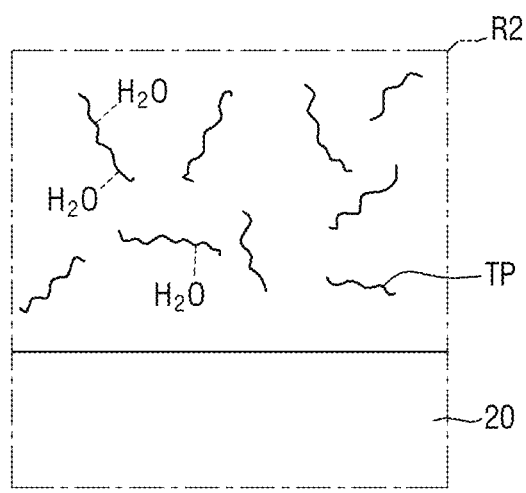

For example, referring to FIGS. 5 and 6, after polishing the hydrophobic layer 20, the chemical mechanical polishing slurry remaining on the polishing object (e.g., the hydrophobic layer 20) may be washed. For reference, FIG. 6 is a schematic enlarged view for explaining a region $R_2$ of FIG. 5.

The thermoresponsive polymer TP adsorbed to the hydrophobic layer 20 may be desorbed from the hydrophobic layer 20, in the process in which the chemical mechanical polishing slurry is washed.

Specifically, the chemical mechanical polishing slurry may be removed at a second temperature at which the thermoresponsive polymer TP of the thermoresponsive inhibitor exhibits hydrophilicity. When the thermoresponsive polymer TP has the lower critical solution temperature (LCST), the second temperature may be lower than the lower critical solution temperature. Alternatively, when the thermoresponsive polymer TP has the upper critical solution temperature (UCST), the second temperature may be higher than the upper critical solution temperature.

In this case, as shown in FIG. 6, the polarity part in the polymer forms hydrogen bonds with water molecules ($H_2O$), and the thermoresponsive polymer TP of the thermoresponsive inhibitor may be hydrated. Such a thermoresponsive polymer TP may be desorbed from the hydrophobic layer 20 and may be easily removed by being dispersed in water.

The chemical mechanical polishing slurry may be removed by, for example, a cleaning liquid. For example, the cleaning liquid may be provided onto the hydrophobic layer 20 after polishing of the hydrophobic layer 20 is completed. In some embodiments, the chemical mechanical polishing slurry may be removed by a cleaning process that uses Standard Clean 1 (SC1) cleaning solution and hydrofluoric acid (HF).

FIGS. 7 to 13 are other intermediate operation diagrams for explaining a method for fabricating a semiconductor device using the chemical mechanical polishing method according to some embodiments. For convenience of explanation, repeated parts of contents explained above using FIGS. 1 to 6 will be briefly explained or omitted.

Figure 7:
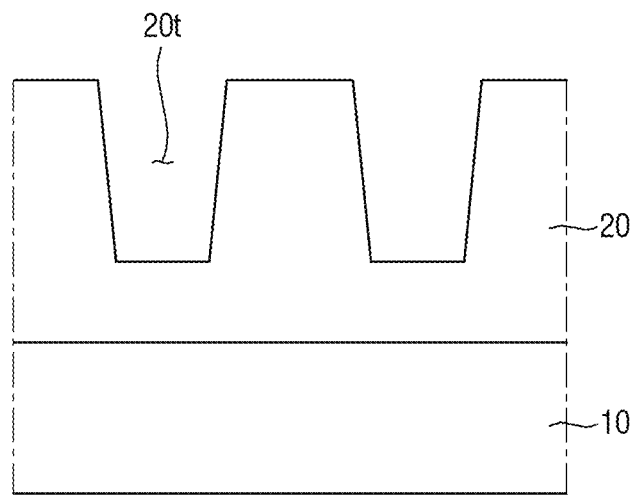
FIGS. 7 to 13 are other intermediate operation diagrams for explaining a method for fabricating a semiconductor device using the chemical mechanical polishing method according to some embodiments.

Referring to FIG. 7, a hydrophobic layer 20 including a trench 20t is formed on a semiconductor substrate 10.

For example, an etching process may be performed on the hydrophobic layer 20 to form the trench 20t inside the hydrophobic layer 20. A width of the trench 20t may be, for example, about 20 nm or less. As an example, the width of trench 20t may be from about 1 nm to about 15 nm.

Figure 8:
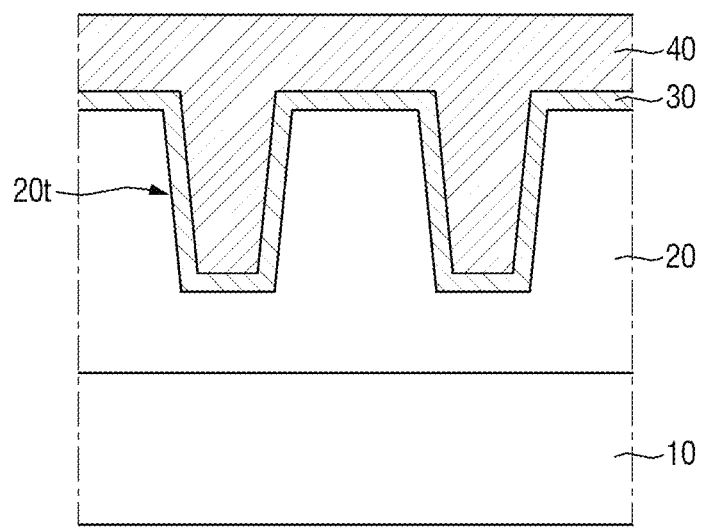

Referring to FIG. 8, target layers 30 and 40 are formed on the hydrophobic layer 20.

The target layers 30 and 40 may fill at least part of the trench 20t of the hydrophobic layer 20. The target layers 30 and 40 may include at least one of a semiconductor material, a conductive material, an insulating material, and combinations thereof. In an example, the target layers 30 and 40 may include semiconductor materials such as polysilicon and/or epitaxial layer. As another example, the target layers 30 and 40 may include conductive materials such as doped polysilicon, metal, metal silicide and/or metal nitride. As another example, the target layers 30 and 40 may include an insulating material such as silicon oxide, silicon nitride, silicon oxynitride, a low dielectric constant (low-k) material having a dielectric constant lower than silicon oxide and/or a high dielectric constant (high-k) material having a dielectric constant higher than silicon oxide.

In some embodiments, the target layers 30 and 40 may include conductive materials for forming wiring of the semiconductor device. For example, the target layers 30 and 40 may include a barrier layer 30 and a metal layer 40 that are sequentially formed on the hydrophobic layer 20. The barrier layer 30 may conformally extend along the profile of the trench 20t. The metal layer 40 may fill the region of the trench 20t that remains after the barrier layer 30 is filled.

The barrier layer 30 may include a metal or metal nitride for preventing diffusion of the metal layer 40. For example, the barrier layer 30 may include, but not limited to, at least one of titanium (Ti), tantalum (Ta), tungsten (W), nickel (Ni), cobalt (Co), platinum (Pt), alloys thereof, nitrides thereof, and combinations thereof.

The metal layer 40 may include a conductive material, for example, but not limited to, at least one of tungsten (W), copper (Cu), ruthenium (Ru), molybdenum (Mo), aluminum (Al), platinum (Pt), and combinations thereof. As an example, the metal layer 40 may include copper (Cu).

Figure 9:
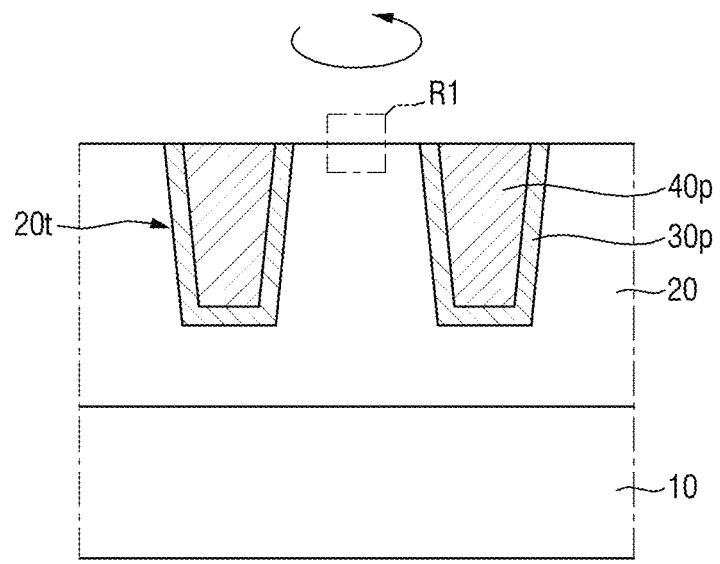
Figure 10:
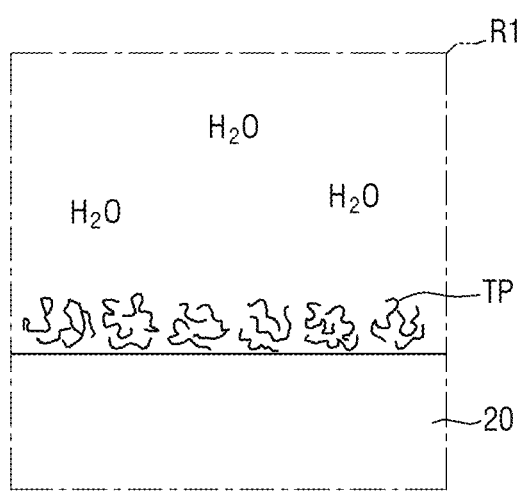

Referring to FIGS. 9 and 10, the target layers 30 and 40 are polished. For reference, FIG. 10 is a schematic enlarged view for explaining a region $R_1$ of FIG. 9.

The target layers 30 and 40 may be the polishing target in the chemical mechanical polishing methods according to some embodiments. As the target layers 30 and 40 are polished, the upper parts of the target layers 30 and 40 may be etched and removed. The hydrophobic layer 20 may be used as an etch stop layer in the polishing process of the target layers 30 and 40. For example, the target layers 30 and 40 may be polished, until the upper surface of the hydrophobic layer 20 is exposed.

As the target layers 30 and 40 are polished, a plurality of target patterns 30p and 40p separated by the hydrophobic layer 20 may be formed. For example, a barrier pattern 30p and a metal pattern 40p that are sequentially stacked may be formed in the trench 20t. Such a metal pattern 40p may form a metal wiring of a semiconductor device, but is not limited thereto.

In some embodiments, the hydrophobic layer 20 may be an inter-wiring insulating layer that separates the plurality of metal patterns 40p. For example, the hydrophobic layer 20 may include a low dielectric constant material having a dielectric constant lower than that of silicon oxide. However, this is merely an example, and the hydrophobic layer 20 may be an etch stop layer or a barrier insulating layer formed on the inter-wiring insulating layer.

The chemical mechanical polishing slurry including the abrasive particles, the thermoresponsive inhibitor and the deionized water may be used to polish the target layers 30 and 40. In the process in which the target layers 30 and 40 are polished, the thermoresponsive inhibitor may protect the hydrophobic layer 20 used as the etch stop layer.

Specifically, the target layers 30 and 40 may be polished at a first temperature at which the thermoresponsive polymer TP of the thermoresponsive inhibitor exhibits hydrophobicity. When the thermoresponsive polymer TP has a lower critical solution temperature (LCST), the first temperature may be higher than the lower critical solution temperature. Alternatively, when the thermoresponsive polymer TP has an upper critical solution temperature (UCST), the first temperature may be lower than the upper critical solution temperature.

In such a case, as shown in FIG. 10, the thermoresponsive polymer TP of the thermoresponsive inhibitor is precipitated into a globule due to the dominant action of the hydrophobic bond in the polymer, and may be separated from water molecules ($H_2O$). Such a thermoresponsive polymer TP is adsorbed to the hydrophobic layer 20 and may protect the hydrophobic layer 20 used as an etch stop layer.

Figure 11:
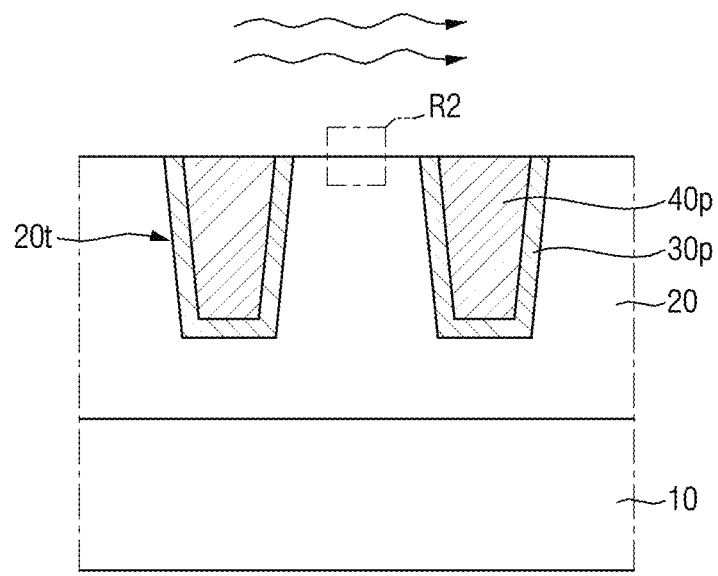
Figure 12:
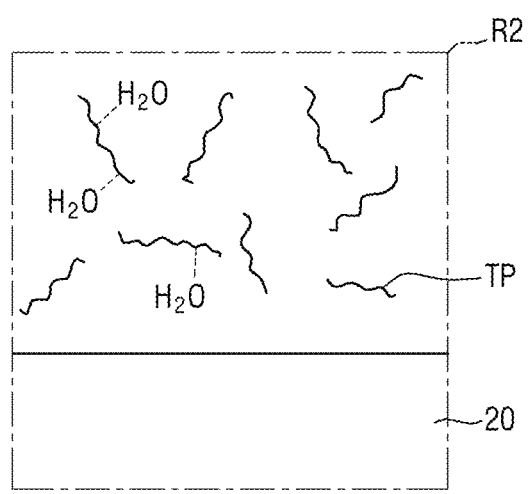

Referring to FIGS. 11 and 12, after polishing the target layers 30 and 40, the chemical mechanical polishing slurry remaining on the polishing target (e.g., the hydrophobic layer 20 and the target layers 30 and 40) is washed. For reference, FIG. 12 is a schematic enlarged view for explaining a region $R_2$ of FIG. 11.

The thermoresponsive polymer TP adsorbed to the hydrophobic layer 20 may be desorbed from the hydrophobic layer 20, in the process in which the chemical mechanical polishing slurry is washed.

Specifically, the chemical mechanical polishing slurry may be removed at a second temperature at which the thermoresponsive polymer TP of the thermoresponsive inhibitor exhibits hydrophilicity. When the thermoresponsive polymer TP has the lower critical solution temperature (LCST), the second temperature may be lower than the lower critical solution temperature. Alternatively, when the thermoresponsive polymer TP has the upper critical solution temperature (UCST), the second temperature may be higher than the upper critical solution temperature.

In this case, as shown in FIG. 12, the polar part in the polymer forms hydrogen bonds with water molecules ($H_2O$), and the thermoresponsive polymer TP of the thermoresponsive inhibitor may be hydrated. Such a thermoresponsive polymer TP may be desorbed from the hydrophobic layer 20 and may be easily removed by being dispersed in water.

The chemical mechanical polishing slurry may be removed by, for example, a cleaning liquid. For example, a cleaning liquid may be provided to the hydrophobic layer 20 after polishing of the hydrophobic layer 20 is completed. In some embodiments, the chemical mechanical polishing slurry may be removed by a cleaning process that uses SC1 cleaning solution and hydrofluoric acid (HF).

Figure 13:
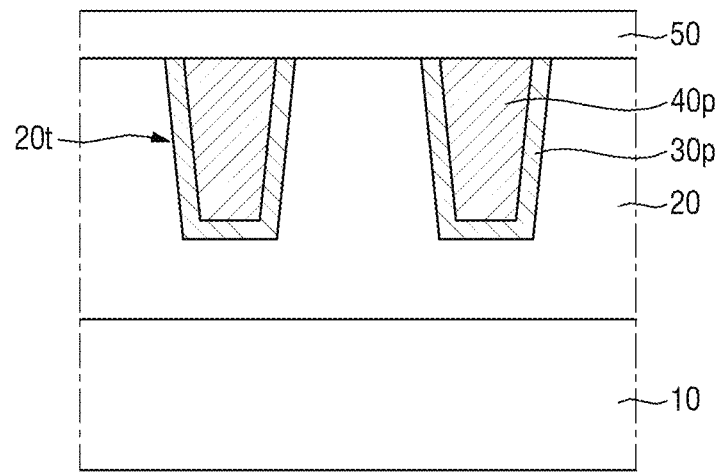

Referring to FIG. 13, a capping layer 50 is formed.

The capping layer 50 may cover the hydrophobic layer 20, the barrier pattern 30$p$ and the metal pattern 40$p$. The capping layer 50 may include, but not limited to, an insulating material, for example, at least one of silicon nitride, silicon carbide, and combinations thereof. In some other embodiments, the capping layer 50 may be omitted.

The hydrophobic layer is widely used as a sacrificial layer, a gate dielectric layer, a passivation layer, and the like of the semiconductor device. On the other hand, in the chemical mechanical polishing process for the hydrophobic layer, a polishing slurry including an inhibitor that protects the hydrophobic layer may be used to improve etch selectivity, dishing, defects, and the like. Although a hydrophobic polymer may be used as such an inhibitor, there is a problem in which the hydrophobic polymer is strongly adsorbed to the hydrophobic layer and is difficult to be removed in subsequent processes.

However, when using the chemical mechanical polishing method according to some embodiments, not only the hydrophobic layer may be efficiently protected in the polishing process, but also the polishing slurry may be easily removed. Specifically, the chemical mechanical polishing method according to some embodiments may utilize the chemical mechanical polishing slurry that includes the thermoresponsive inhibitor that exhibits a reversible phase-transition at a specific temperature. As described above, polishing of the polishing object (e.g., the hydrophobic layer 20 and/or target layers 30 and 40) is performed at a temperature (e.g., the first temperature) at which the thermoresponsive inhibitor exhibits hydrophobicity. Therefore, the thermoresponsive inhibitor is adsorbed to the hydrophobic layer 20 in the polishing process, and may effectively protect the hydrophobic layer 20. In addition, since the removal of the polishing slurry may be performed at a temperature (for example, the second temperature) at which the thermoresponsive inhibitor exhibits hydrophobicity, the thermoresponsive inhibitor may be desorbed from the hydrophobic layer 20 and may be easily removed from the hydrophobic layer 20. This makes it possible to provide a chemical mechanical polishing method that improves the quality and productivity of the chemical mechanical polishing process.

A chemical mechanical polishing apparatus using the chemical mechanical polishing method according to an example embodiment will be described below referring to FIG. 14.

Figure 14:
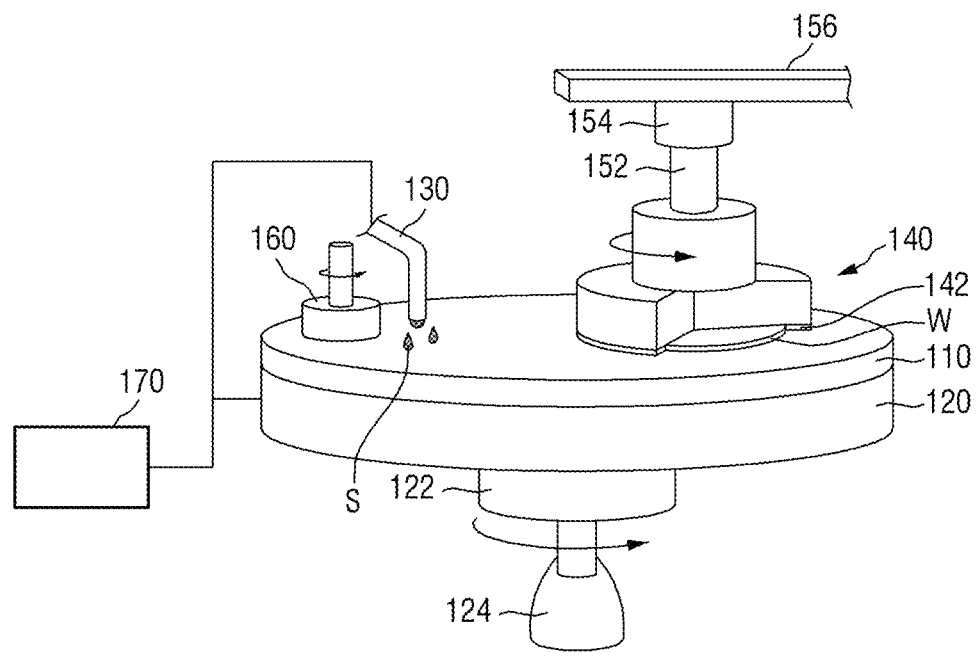
FIG. 14 is a schematic perspective view for explaining the chemical mechanical polishing apparatus that utilizes the chemical mechanical polishing method according to some embodiment.

FIG. 14 is a schematic perspective view for explaining the chemical mechanical polishing apparatus that utilizes the chemical mechanical polishing method according to some embodiments. The chemical mechanical polishing apparatus shown in FIG. 14 is merely an example, and embodiment of inventive concepts are not limited to such an apparatus.

Referring to FIG. 14, the chemical mechanical polishing apparatus according to some embodiments includes a polishing pad 110, a platen 120, a slurry supply 130 (e.g., a conduit with a nozzle for supplying slurry, where the conduit may be connected to a container for storing slurry and the conduit may be disposed to supply slurry via the container to the polishing pad 110), a carrier head assembly 140, a pad conditioner 160, and a temperature controller 170.

The polishing pad 110 may be placed on the platen 120. The polishing pad 110 may be provided as a plate having a constant thickness, for example, but not limited to, a circular plate. The polishing pad 110 may include a polishing surface having a desired and/or alternatively predetermined roughness. The polishing surface of the polishing pad 110 may come into contact with a wafer W to polish the wafer W, while the chemical mechanical polishing process is performed.

The polishing pad 110 may include a porous material having a plurality of microspaces. The microspaces of the polishing pad 110 may accommodate the polishing slurry S that is provided while the chemical mechanical polishing process is performed. The polishing pad 110 may include, for example, but not limited to, a polyurethane pad.

In some embodiments, the polishing pad 110 may further include a conductive material. The polishing pad 110, which is a conductor, may be grounded to limit and/or prevent short circuits. In some other embodiments, the polishing pad 110 may be non-conductive.

The platen 120 may be rotatable. The rotatable platen 120 may rotate the polishing pad 110 placed on the platen 120. For example, a first driving shaft 122 connected to a lower part of the platen 120 may rotate by receiving rotational power from a first motor 124. Such a platen 120 may rotate the polishing pad 110 around a rotation axis perpendicular to an upper surface of the platen 120.

The slurry supply 130 may be placed adjacent to the polishing pad 110. The slurry supply 130 may supply the polishing slurry S onto the polishing pad 110, while the chemical mechanical polishing process is performed. The polishing slurry S may include the chemical mechanical polishing slurry described above. For example, the polishing slurry S may include the abrasive particles, the thermoresponsive inhibitor, and the deionized water.

The carrier head assembly 140 may be placed adjacent to the polishing pad 110. The carrier head assembly 140 may provide the wafer W onto the polishing pad 110. The above-described polishing target (for example, the hydrophobic layer 20 and/or the target layers 30 and 40) may be provided on the polishing surface of the wafer W. The carrier head assembly 140 is operable to hold wafer W against the polishing pad 110. The carrier head assembly 140 may independently control polishing parameters (e.g., pressure, etc.) associated with each wafer W.

For example, the carrier head assembly 140 may include a retaining ring 142 for retaining wafer W under a flexible membrane. Such a carrier head assembly 140 may include a plurality of pressurizable chambers which are defined by the flexible membrane and independently controllable. The pressurizable chambers may apply independently controllable pressure to the relevant zones on the flexible membrane or the relevant zones on the wafer W.

The carrier head assembly 140 may be rotatable. The rotatable carrier head assembly 140 may rotate the wafer W fixed to the carrier head assembly 140. For example, a second driving shaft 152 connected to the upper part of the carrier head assembly 140 may rotate by receiving rotational power from a second motor 154.

The carrier head assembly 140 may be supported by a support structure 156. The support structure 156 may be, for example, but not limited to, a carousel or a track. In some embodiments, the carrier head assembly 140 may translate laterally across the upper surface of the polishing pad 110. For example, the carrier head assembly 140 may vibrate, on a slider of the support structure 156 or by rotational vibration of the support structure 156 itself.

Although only one carrier head assembly 140 is shown on the polishing pad 110 in FIG. 14, this is merely an example. As another example, the plurality of carrier head assemblies 140 may, of course, be provided on the polishing pad 110 to efficiently use the surface area of the polishing pad 110. Although FIG. 14 only shows that the rotational direction of the platen 120 is the same as the rotational direction of the carrier head assembly 140, this is merely an example, and it is a matter of course that they may rotate in different rotational directions from each other.

A pad conditioner 160 may be placed adjacent to the polishing pad 110. The pad conditioner 160 may perform a conditioning process on the polishing pad 110. The pad conditioner 160 may stably maintain a polishing surface of the polishing pad 110 so that the wafer W is effectively polished during the chemical mechanical polishing process.

A temperature controller 170 may control the polishing temperature at which the chemical mechanical polishing process for the wafer W is performed. For example, the temperature controller 170 may be connected to platen 120 to heat or cool the temperature of the polishing pad 110 placed on the platen 120. Alternatively, for example, the temperature controller 170 may be connected to the slurry supply 130 to heat or cool the temperature of the polishing slurry S supplied from the slurry supply 130. The temperature controller 170 may include, for example, but not limited to, a temperature controlling device.

The chemical mechanical polishing apparatus according to some embodiments may utilize the chemical mechanical polishing method described above. For example, as described above, the polishing slurry S supplied from the slurry supply 130 may include the thermoresponsive inhibitor that exhibits a reversible phase-transition at a specific temperature. Thus, depending on the polishing temperature controlled by a temperature controller (e.g., 170 of FIG. 14) or the like, the chemical mechanical polishing apparatus according to some embodiments may effectively protect the hydrophobic layer during the polishing process, and may easily remove the polishing slurry.

Hereinafter, the effect of chemical mechanical polishing method according to some embodiments will be described referring to test example 1, test example 2, comparative example 1, comparative example 2, and FIGS. 15 to 18.

FIGS. 15 to 18 are graphs for explaining the effect of chemical mechanical polishing method according to some embodiments.

Test Example 1

The polishing slurry having a pH of 4 was prepared by mixing 1% by weight of colloidal silica as the abrasive particles and 0.1% by weight of poly(N-isopropylacrylamide) as the thermoresponsive inhibitor in deionized water. Then, the polysilicon wafer was dried after dipping at 50° C. using the polishing slurry, and the degree of adsorption of the thermoresponsive inhibitor on the polysilicon wafer was measured through ATR-FTIR (Attenuated Total Reflectance-Fourier Transform Infrared Spectroscopy) analysis and shown in FIG. 15.

Test Example 2

Figure 16:
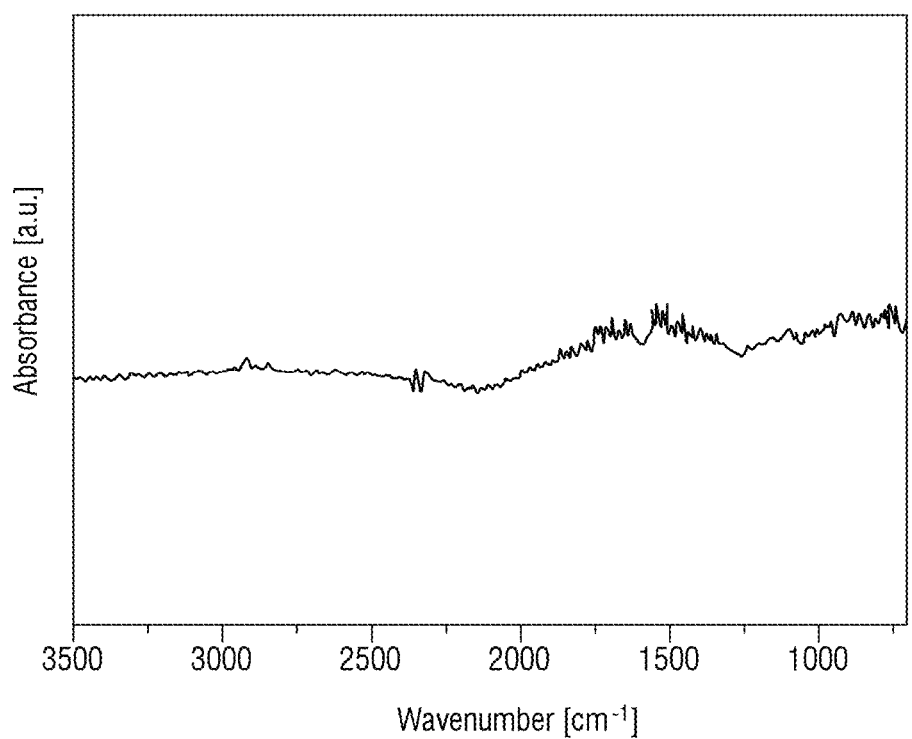

The polysilicon wafer was dried after dipping at room temperature (25° C.) using the polishing slurry according to the test example 1, and the degree of adsorption of the thermoresponsive inhibitor on the polysilicon wafer was measured through ATR-FTIR analysis and shown in FIG. 16.

Comparative Example 1

The polishing slurry was prepared in the same manner as in the test example 1, except that PEG (polyethylene glycol) was used as a comparative inhibitor instead of the thermoresponsive inhibitor. Next, the polysilicon wafer was dried after dipping at 50° C. using the polishing slurry, and the degree of adsorption of the comparative inhibitor on the polysilicon wafer was measured through ATR-FTIR analysis and shown in FIG. 17.

Comparative Example 2

Figure 18:
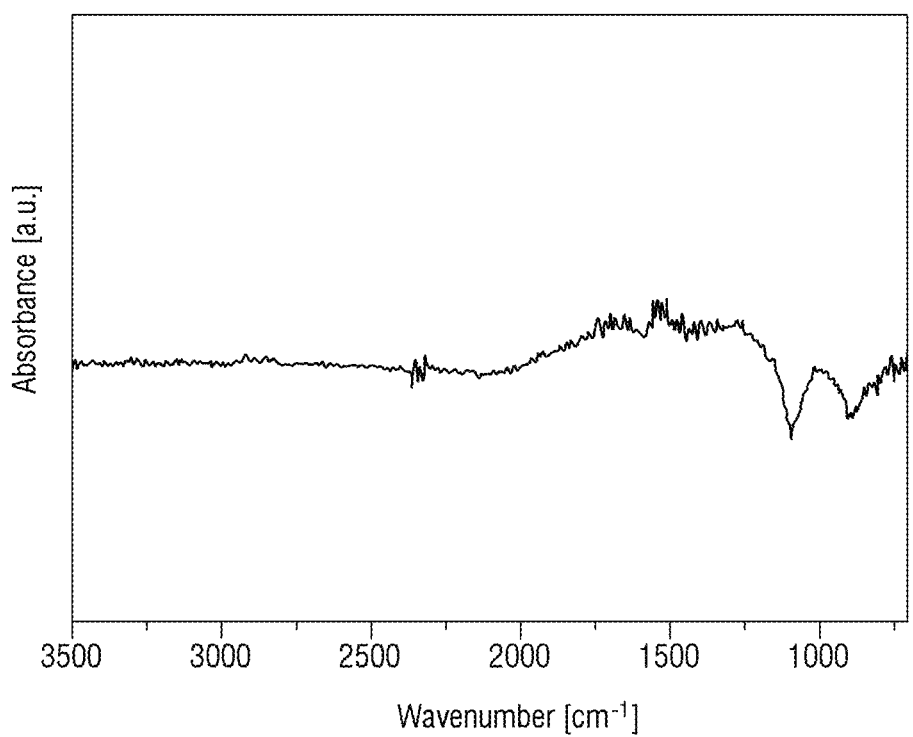

The polysilicon wafer was dried after dipping at room temperature (25° C.) using the polishing slurry according to the test example 1, and the degree of adsorption of the comparative inhibitor on the polysilicon wafer was measured through ATR-FTIR analysis and shown in FIG. 18.

Figure 15:
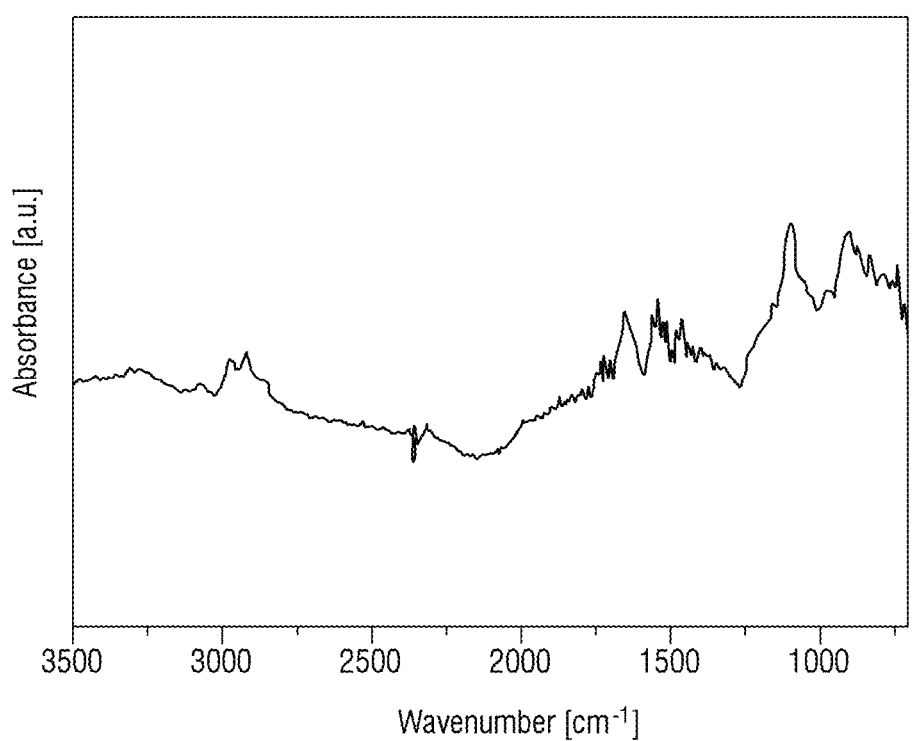
FIGS. 15 to 18 are graphs for explaining the effect of chemical mechanical polishing method according to some embodiments.

Referring to FIGS. 15 and 16, it may be confirmed that the thermoresponsive inhibitor (poly(N-isopropylacrylamide)) according to the test examples 1 and 2 exhibit a relatively high adsorption rate at 50° C., but exhibits a relatively low adsorption rate at 25° C. This may be understood that, as mentioned above, in the case of the thermoresponsive inhibitor (poly(N-isopropylacrylamide)), it exhibits hydrophobicity at a temperature higher than the lower critical solution temperature (e.g., 50° C.) and exhibits the high adsorption rate on the hydrophobic layer (e.g., polysilicon wafer), but exhibits hydrophilicity at a temperature lower than the lower critical solution temperature (e.g., 25° C.) and is easily desorbed from the hydrophobic layer.

Figure 17:
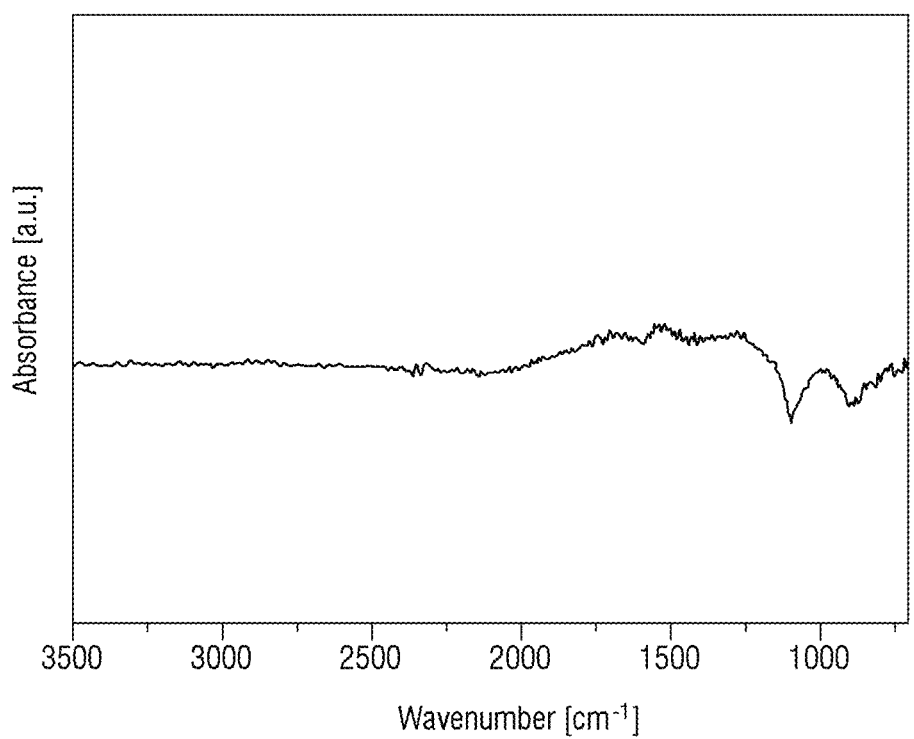

In contrast, referring to FIGS. 17 and 18, it may be confirmed that the inhibitor PEG according to the comparative examples 1 and 2 exhibit similar adsorption rate at 50° C. and 25° C. This may be understood that, in the case of the comparative inhibitor PEG according to the comparative examples 1 and 2, the hydrophobic bond acts predominantly at both 50° C. and 25° C., and the comparative inhibitor exhibits high adsorption on the hydrophobic layer.

Therefore, as compared to the chemical mechanical polishing method that uses the comparative inhibitor, the chemical mechanical polishing method using the thermoresponsive inhibitor may efficiently remove the polishing slurry at a relatively low temperature. This makes it possible to provide a chemical mechanical polishing method that improves the quality and productivity of the chemical mechanical polishing process.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments of the present disclosure have been described above with reference to the accompanying drawings, inventive concepts may be implemented in various different forms. Those skilled in the art to which the present disclosure pertains may understand that embodiments of inventive concepts may be implemented in other specific forms without departing from the spirit and scope of inventive concepts. Therefore, it should be understood that the example embodiments described above are illustrative in all aspects and not restrictive.

What is claimed is:

1. A chemical mechanical polishing method of a polishing object including a hydrophobic layer, the chemical mechanical polishing method comprising:
    polishing the polishing object at a first temperature using a chemical mechanical polishing slurry; and
    removing the chemical mechanical polishing slurry on the polishing object at a second temperature, the second temperature being different from the first temperature, wherein
    the chemical mechanical polishing slurry includes abrasive particles, a thermoresponsive inhibitor, and deionized water,
    the thermoresponsive inhibitor includes a thermoresponsive polymer exhibiting a phase-transition between the first temperature and the second temperature,
    the thermoresponsive polymer is adsorbed to the hydrophobic layer at the first temperature and desorbed from the hydrophobic layer at the second temperature, and
    the thermoresponsive polymer includes at least one of poly(2-carboxyisopropylacrylamide), poly(N-(L)-(1-hydroxymethyl) propylmethacrylamide, poly(N-acryloyl-N'-alkylpiperazine), or xyloglucan.

2. The chemical mechanical polishing method of claim 1, wherein the hydrophobic layer includes at least one of polysilicon, SiOCH, SiOCN, and SiBN.

3. The chemical mechanical polishing method of claim 1, wherein
    the thermoresponsive polymer has a lower critical solution temperature in aqueous solution,
    the first temperature is higher than the lower critical solution temperature, and
    the second temperature is lower than the lower critical solution temperature.

4. The chemical mechanical polishing method of claim 1, wherein
    the thermoresponsive polymer has an upper critical solution temperature in aqueous solution,
    the first temperature is lower than the upper critical solution temperature, and
    the second temperature is higher than the upper critical solution temperature.

5. The chemical mechanical polishing method of claim 1, wherein
    polishing the polishing object includes polishing the hydrophobic layer.

6. The chemical mechanical polishing method of claim 1, wherein
    polishing the polishing object includes using the hydrophobic layer as an etch stop layer.

7. The chemical mechanical polishing method of claim 1, wherein the thermoresponsive polymer includes poly(2-carboxyisopropylacrylamide).

8. The chemical mechanical polishing method of claim 1, wherein on a basis of 100% by weight of the chemical mechanical polishing slurry,
    a content of the abrasive particles is 0.1% by weight to 10% by weight, and
    a content of the thermoresponsive inhibitor is 0.001% by weight to 5% by weight.

9. The chemical mechanical polishing method of claim 1, wherein
    a pH of the chemical mechanical polishing slurry is 1 to 7.

10. The chemical mechanical polishing method of claim 1,
    wherein the thermoresponsive polymer includes poly(N-(L)-(1-hydroxymethyl) propylmethacrylamide.

11. The chemical mechanical polishing method of claim 1,
    wherein the thermoresponsive polymer includes poly(N-acryloyl-N'-alkylpiperazine).

12. The chemical mechanical polishing method of claim 1,
    wherein the thermoresponsive polymer includes xyloglucan.

13. A chemical mechanical polishing method of a polishing object including a hydrophobic layer, the chemical mechanical polishing method comprising:
    polishing the polishing object using the hydrophobic layer as an etch stop layer and using a chemical mechanical polishing slurry,
        the chemical mechanical polishing slurry including abrasive particles, a thermoresponsive inhibitor, and deionized water,
        the thermoresponsive inhibitor includes a thermoresponsive polymer,
        the thermoresponsive polymer having a lower critical solution temperature,
        the thermoresponsive polymer includes at least one of poly(2-carboxyisopropylacrylamide), poly(N-(L)-(1-hydroxymethyl) propylmethacrylamide, poly(N-acryloyl-N'-alkylpiperazine), or xyloglucan, and
        the polishing the polishing object being performed at a first temperature, the first temperature being higher than the lower critical solution temperature; and
    removing the chemical mechanical polishing slurry on the polishing object at a second temperature, the second temperature being lower than the lower critical solution temperature.

14. The chemical mechanical polishing method of claim 13, wherein the removing the chemical mechanical polishing slurry is performed using a Standard Clean 1 cleaning solution and hydrofluoric acid.

15. The chemical mechanical polishing method of claim 13, wherein the lower critical solution temperature is 30° C. to 50° C.

16. The chemical mechanical polishing method of claim 13, wherein the abrasive particles include silica.

17. The chemical mechanical polishing method of claim 16, wherein the abrasive particles include colloidal silica.

18. A method for fabricating a semiconductor device, the method for fabricating the semiconductor device comprising:

forming a polishing object on a semiconductor substrate, the polishing object including a hydrophobic layer;

polishing the polishing object at a first temperature using a chemical mechanical polishing slurry; and removing the chemical mechanical polishing slurry on the polishing object at a second temperature, the second temperature being different than the first temperature, wherein the chemical mechanical polishing slurry includes abrasive particles, a thermoresponsive inhibitor, and deionized water, the thermoresponsive inhibitor includes a thermoresponsive polymer exhibiting a phase-transition between the first temperature and the second temperature, the thermoresponsive polymer includes at least one of poly(2-carboxyisopropylacrylamide), poly(N-(L)-(1-hydroxymethyl) propylmethacrylamide, poly(N-acryloyl-N'-alkylpiperazine), or xyloglucan, and the thermoresponsive polymer is adsorbed to the hydrophobic layer at the first temperature and desorbed from the hydrophobic layer at the second temperature.

19. The method for fabricating the semiconductor device of claim 18, wherein polishing the polishing object includes polishing the hydrophobic layer.

20. The method for fabricating the semiconductor device of claim 18, wherein the polishing object further includes a target layer on the hydrophobic layer, and the polishing the polishing object includes polishing the target layer using the hydrophobic layer as an etch stop layer.

* * * * *